United States Patent
Lin

(10) Patent No.: US 10,267,844 B2
(45) Date of Patent: Apr. 23, 2019

(54) PANEL STRUCTURE WITH DETECTING CIRCUIT AND DETECTING CIRCUIT FOR PANEL

(71) Applicant: AU OPTRONICS CORPORATION, Hsin-chu (TW)

(72) Inventor: Neng-Yi Lin, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 253 days.

(21) Appl. No.: 15/402,557

(22) Filed: Jan. 10, 2017

(65) Prior Publication Data
US 2017/0370982 A1 Dec. 28, 2017

(30) Foreign Application Priority Data

Jun. 27, 2016 (TW) .............................. 105120198 A

(51) Int. Cl.
*G01R 31/14* (2006.01)
*G01R 31/28* (2006.01)
*G09G 3/20* (2006.01)

(52) U.S. Cl.
CPC .......... *G01R 31/14* (2013.01); *G01R 31/2825* (2013.01); *G09G 3/20* (2013.01); *G09G 2300/0426* (2013.01); *G09G 2330/06* (2013.01); *G09G 2330/12* (2013.01)

(58) Field of Classification Search
CPC ...... G01R 31/14; G01R 31/2825; G09G 3/20; G09G 2330/12; G09G 2330/06; G09G 2300/0426

USPC ................................. 324/511, 510, 509, 500
See application file for complete search history.

(56) References Cited

U.S. PATENT DOCUMENTS

| 3,858,159 | A | * | 12/1974 | Worth | ............... | H01R 12/675 |
| | | | | | | 439/399 |
| 8,233,974 | B2 | * | 7/2012 | Ward | ............... | A61B 5/0537 |
| | | | | | | 600/547 |
| 2008/0303138 | A1 | * | 12/2008 | Flett | ............... | H01L 23/473 |
| | | | | | | 257/714 |
| 2016/0231377 | A1 | | 8/2016 | Wen et al. | | |

FOREIGN PATENT DOCUMENTS

WO 2016008099 A1 1/2016

* cited by examiner

*Primary Examiner* — Giovanni Astacio-Oquendo
(74) *Attorney, Agent, or Firm* — Tim Tingkang Xia, Esq.; Locke Lord LLP

(57) ABSTRACT

A detecting circuit for a panel adapted for detecting a panel which has a grounding loop is disclosed. The detecting circuit for a panel includes a first switch and a first multiplexer. The first switch is electrically connected to the grounding loop and a first ground terminal. The first switch is off in a detecting mode and on in a protection mode. The first multiplexer is electrically connected to the grounding loop and a second ground terminal. In the detecting mode, the current path between a first signal terminal of the first multiplexer and the grounding loop is conducted by the first multiplexer. In the protection mode, the current path between the second ground terminal and the grounding loop is conducted by the first multiplexer.

18 Claims, 6 Drawing Sheets

PANEL STRUCTURE WITH DETECTING CIRCUIT AND DETECTING CIRCUIT FOR PANEL

CROSS-REFERENCE TO RELATED PATENT APPLICATION

This application claims the benefit of priority to Taiwan Patent Application No. 105120198, filed Jun. 27, 2016. The entire content of the above identified application is incorporated herein by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD

The present invention relates to a panel structure with a detecting circuit and a detecting circuit for a panel, and more particularly, to a panel structure with a detecting circuit for switching a current path and a detecting circuit for a panel.

BACKGROUND

In today's high-tech industries, electrostatic discharge (Electrostatic Discharge, ESD) is a subject of attention. Especially for the precise panel industry, an impact of static electricity damages a panel manufacturing process, thus decreasing a panel yield. Therefore, in order to improve an antistatic capability of a panel, a grounding loop is generally designed at the periphery of the panel, so as to prevent the panel from being damaged by static electricity. On the other hand, for a panel manufacturer, a panel needs to be detected (for example, detecting whether the panel is broken) before the panel is shipped to a customer. In order to detect the panel, an additional line for detecting the panel is generally added at the periphery of the panel. However, in this case, if the panel needs to synchronously have the antistatic grounding loop and the line for detecting the panel, the antistatic grounding loop and the line for detecting the panel occupy space at the periphery of the panel, such that the panel fails to achieve an effect of a narrow bezel.

SUMMARY

The present invention provides a panel structure with a detecting circuit and a detecting circuit for a panel, which synchronously has an antistatic function and a panel detection function by sharing a same grounding loop, so as to reduce space at the periphery of the panel that is occupied by lines, thereby achieving an effect of a narrow bezel of the panel.

A detecting circuit for a panel disclosed according to an embodiment of the present invention is adapted for detecting a panel that has a grounding loop. The detecting circuit for a panel includes a first switch and a first multiplexer. The first switch is electrically connected to the grounding loop and a first ground terminal. The first switch is off in a detecting mode and on in a protection mode. The first multiplexer is electrically connected to the grounding loop and a second ground terminal. In the detecting mode, a current path between a first signal terminal of the first multiplexer and the grounding loop is conducted by the first multiplexer. In the protection mode, a current path between the second ground terminal and the grounding loop is conducted by the first multiplexer.

A panel structure with a detecting circuit disclosed according to another embodiment of the present invention includes a panel, a grounding loop, a control circuit, and a detecting circuit for a panel. The panel has at least a first side edge, a second side edge, and a third side edge. The grounding loop extends along the first side edge, the second side edge, and the third side edge, and has a first terminal and a second terminal, where the first terminal is adjacent to the first side edge, and the second terminal is adjacent to the third side edge. The control circuit is configured to output a detecting signal. The detecting circuit for a panel includes a first switch, a first multiplexer, a second switch, and a second multiplexer. The first switch is electrically connected to the first terminal of the grounding loop and a first ground terminal. The first switch is off in a detecting mode and on in a protection mode. The first multiplexer is electrically connected to the control circuit, the first terminal of the grounding loop, and a second ground terminal. In the detecting mode, a current path between the control circuit and the first terminal of the grounding loop is conducted by the first multiplexer, and in the protection mode, a current path between the second ground terminal and the first terminal of the grounding loop is conducted by the first multiplexer. The second switch is electrically connected to the second terminal of the grounding loop and a third ground terminal. The second switch is off in the detecting mode and on in the protection mode. The second multiplexer is electrically connected to the second terminal of the grounding loop and a fourth ground terminal. In the detecting mode, a current path between the grounding loop and a second signal terminal of the second multiplexer is conducted by the second multiplexer, and in the protection mode, a current path between the second terminal of the grounding loop and the fourth ground terminal is conducted by the second multiplexer.

To sum up, with the panel structure with a detecting circuit and the detecting circuit for a panel disclosed in the present invention, synchronously having an antistatic function and a panel detection function is achieved by switching the multiplexers and the switches and sharing the same grounding loop, so as to reduce space at the periphery of the panel that is occupied by lines, thereby achieving an effect of a narrow bezel of the panel.

The foregoing description of the disclosure and the following description of implementation manners are intended to demonstrate and explain the spirit and principle of the present invention and to provide further explanations of the claims of the present invention.

DETAILED DESCRIPTION

Specific features and advantages of the present invention are described in detail in the implementation manners below, and content of the specific features and advantages is sufficient for a person skilled in the art to understand the technical content of the present invention and to carry out implementation on the basis thereof. Moreover, according to the disclosure of the description, the claims, and the drawings, a person skilled in the art can easily understand related objectives and advantages of the present invention. The embodiments below are intended to further describe the perspectives of the present invention in detail, but are not intended to use any perspective to limit the scope of the present invention.

Figure 1:
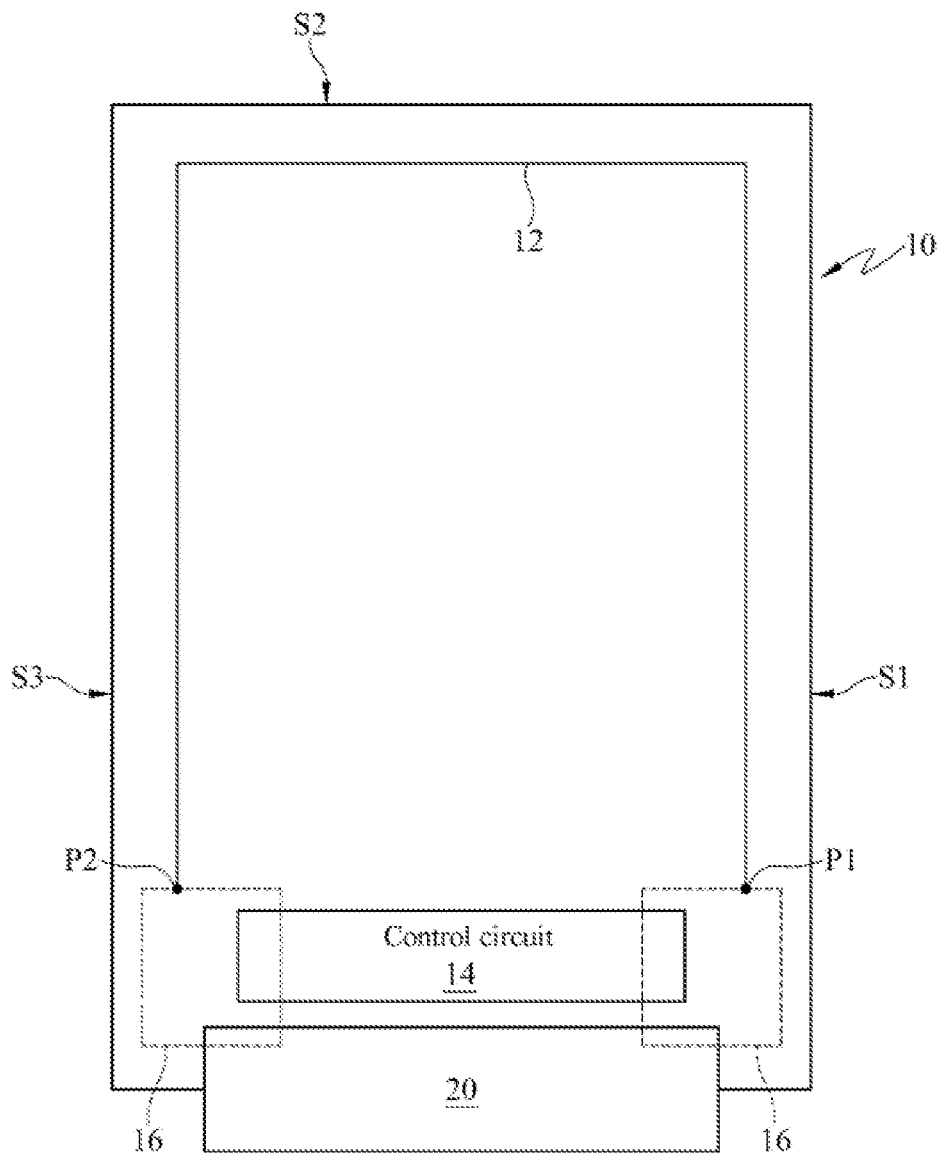
FIG. 1 is a schematic diagram of a panel structure with a detecting circuit according to an embodiment of the present invention.

Referring to FIG. 1, FIG. 1 is a schematic diagram of a panel structure with a detecting circuit according to an embodiment of the present invention. As shown in FIG. 1, a panel 10 has a first side edge S1, a second side edge S2, and a third side edge S3. A grounding loop 12 extends along the first side edge S1, the second side edge S2, and the third side edge S3, and the grounding loop 12 has a first terminal P1 and a second terminal P2, where the first terminal P1 is adjacent to the first side edge S1, and the second terminal P2 is adjacent to the third side edge S3. Specifically, in an example, the grounding loop 12 is a signal line or a discharge path, and the grounding loop 12 starts from the first terminal P1 and goes along the periphery of the panel 10 to arrive at the second terminal P2, and receives a ground signal from a ground terminal. In an example, a signal is transmitted from the first terminal P1, and enters the second terminal P2 along the grounding loop 12. In another example, a signal is transmitted from the second terminal P2, and enters the first terminal P1 along the grounding loop 12. A control circuit 14 is configured to output a detecting signal DS. In an embodiment, a detecting signal DS output by a control circuit 14 is a periodically changing signal, such as a pulse signal or a sinusoidal signal, for detecting whether a panel 10 has a flaw, for example, a panel breakage.

Figure 2:
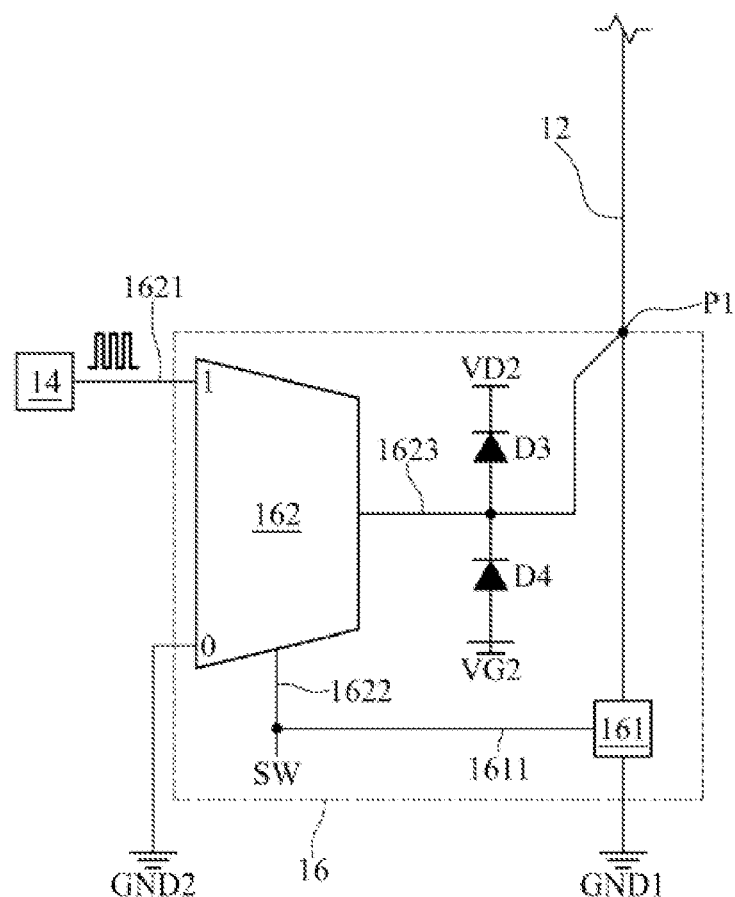
FIG. 2 is an architecture diagram of a part of a detecting circuit for a panel 16 according to the embodiment of FIG. 1 of the present invention.

As shown in FIG. 1, in this embodiment, a detecting circuit for a panel 16 is configured at two ends of the control circuit 14, and is connected to the control circuit 14. In an embodiment, a control circuit 14 is included in a detecting circuit for a panel 16. However, in another embodiment, a detecting circuit for a panel 16 may be configured at another position relative to a control circuit 14. Referring to FIG. 1 and FIG. 2, FIG. 2 is an architecture diagram of a part of the detecting circuit for a panel 16 according to the embodiment of FIG. 1 of the present invention. As shown in FIG. 2, the detecting circuit for a panel 16 includes a first switch 161 and a first multiplexer 162. The first switch 161 is electrically connected to the first terminal P1 of the grounding loop 12 and a first ground terminal GND1. The first switch 161 is off in the detecting mode and on in the protection mode. That is, in the detecting mode, the first switch 161 is in an off state, so that a current path between the grounding loop 12 and the first ground terminal GND1 is disconnected. However, in the protection mode, the first switch 161 is in an on state, so that the current path between the grounding loop 12 and the first ground terminal GND1 is conducted. A first signal terminal 1621 of the first multiplexer 162 is electrically connected to the control circuit 14, the first terminal P1 of the grounding loop 12, and a second ground terminal GND2. In the detecting mode, a current path between the control circuit 14 connected to the first signal terminal 1621 and the first terminal P1 of the grounding loop 12 is conducted by the first multiplexer 162, so that the detecting signal DS output by the control circuit 14 enters the grounding loop 12 from the first terminal P1 of the grounding loop 12. In the protection mode, a current path between the second ground terminal GND2 and the first terminal P1 of the grounding loop 12 is conducted by the first multiplexer 162, so that the current path between the grounding loop 12 and the second ground terminal GND2 is conducted.

Figure 3:
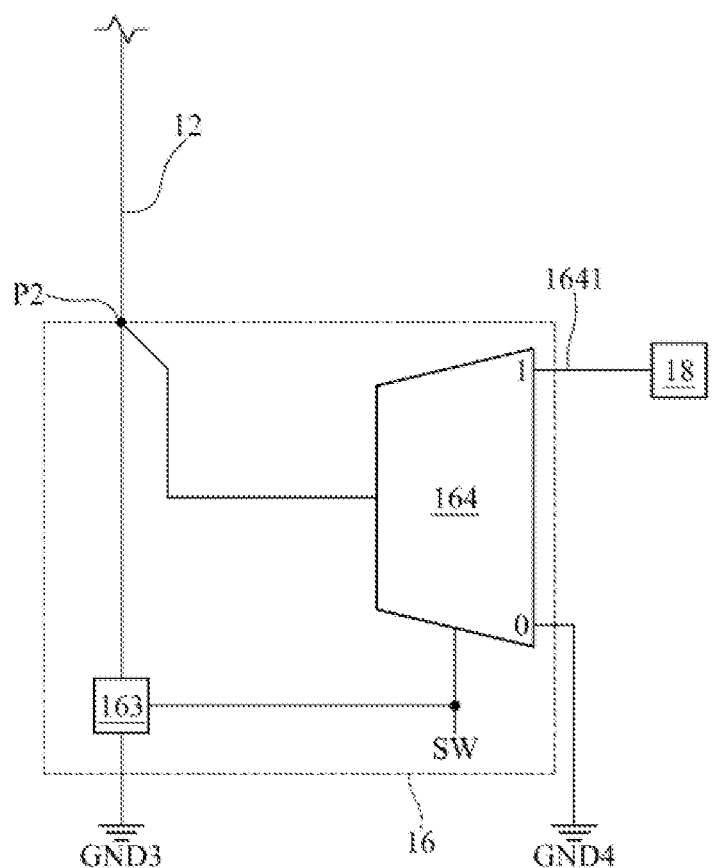
FIG. 3 is an architecture diagram of a part of the detecting circuit for a panel 16 according to the embodiment of FIG. 1 of the present invention.

Referring to FIG. 3, FIG. 3 is an architecture diagram of a part of the detecting circuit for a panel 16 according to the embodiment of FIG. 1 of the present invention. In an embodiment, in addition to a first switch 161 and a first multiplexer 162, the detecting circuit for a panel 16 further includes a second switch 163 and a second multiplexer 164, as shown in FIG. 3. The second switch 163 is electrically connected to the second terminal P2 of the grounding loop 12 and a third ground terminal GND3. The second switch 163 is off in the detecting mode and on in the protection mode. That is, in the detecting mode, the second switch 163 is in an off state, so that a current path between the grounding loop 12 and the third ground terminal GND3 is disconnected. However, in the protection mode, the second switch 163 is in an on state, so that the current path between the grounding loop 12 and the third ground terminal GND3 is conducted.

The second multiplexer 164 is electrically connected to the second terminal P2 of the grounding loop 12 and a fourth ground terminal GND4. In the detecting mode, a current path between the grounding loop 12 and a second signal terminal 1641 of the second multiplexer 164 is conducted by the second multiplexer 164, so that the second terminal P2 of the grounding loop 12 outputs a feedback signal FS to the second signal terminal 1641 of the second multiplexer 164. In this embodiment, the feedback signal FS is a signal formed after the detecting signal DS output by the control circuit 14 passes through the grounding loop 12. In the protection mode, a current path between the second terminal P2 of the grounding loop 12 and a fourth ground terminal GND4 is conducted by the second multiplexer 164, so that the current path between the grounding loop 12 and the fourth ground terminal GND4 is conducted. In this embodiment, the first ground terminal GND1 and the third ground terminal GND3 are located on a flexible circuit board 20 or glass, and the second ground terminal GND2 and the fourth ground terminal GND4 are located in the control circuit 14.

In an embodiment, both of a main control terminal 1611 of a first switch 161 and a main control terminal 1622 of a first multiplexer 162 receive an input signal SW, and a detecting circuit for a panel 16 selectively enters a detecting mode or a protection mode according to the input signal SW. In an actual example, the first switch 161 may be a transistor switch, or another equivalent electronic device with a switching function. In an example, the input signal SW has a high level state and a low level state. When the input signal SW is in the high level state, enter the detecting mode. In the detecting mode, the panel may be detected by means of the detecting signal DS output by the control circuit 14 and the foregoing feedback signal FS. When the input signal SW is in the low level state, enter the protection mode. In the protection mode, by means of the first ground terminal GND1, the second ground terminal GND2, the third ground terminal GND3, and the fourth ground terminal GND4, a current generated by static electricity may be prevented from damaging a circuit on the panel, and further be prevented from damaging normal operation of the circuit on the panel.

In an embodiment, a second signal terminal 1641 of a second multiplexer 164 is electrically connected to a control logic gate 18. In a detecting mode, the control logic gate 18 receives a feedback signal FS from the second signal terminal 1641 of the second multiplexer 164, and the control logic gate 18 determines, according to a detecting signal DS and the feedback signal FS, whether a panel has a flaw. Specifically, in an embodiment, a control logic gate 18 determines, according to a quantity of pulses of a detecting signal DS and a quantity of pulses of a feedback signal FS, whether a panel has a flaw. If the quantity of pulses of the detecting signal DS is different from the quantity of pulses of the feedback signal FS, the control logic gate 18 determines that the panel has a flaw. In this embodiment, the control logic gate 18 is configured in the control circuit 14. In another embodiment, a control logic gate 18 is configured at another position outside a control circuit 14. The present invention does not limit that the control circuit 14 outputs the detecting signal DS and the control logic gate 18 receives the feedback signal FS. In an embodiment, a detecting signal DS may be output through a control logic gate 18, and a feedback signal FS may be received by a control circuit 14. That is, the control circuit 14 and the control logic gate 18 can replace each other.

Figure 4:
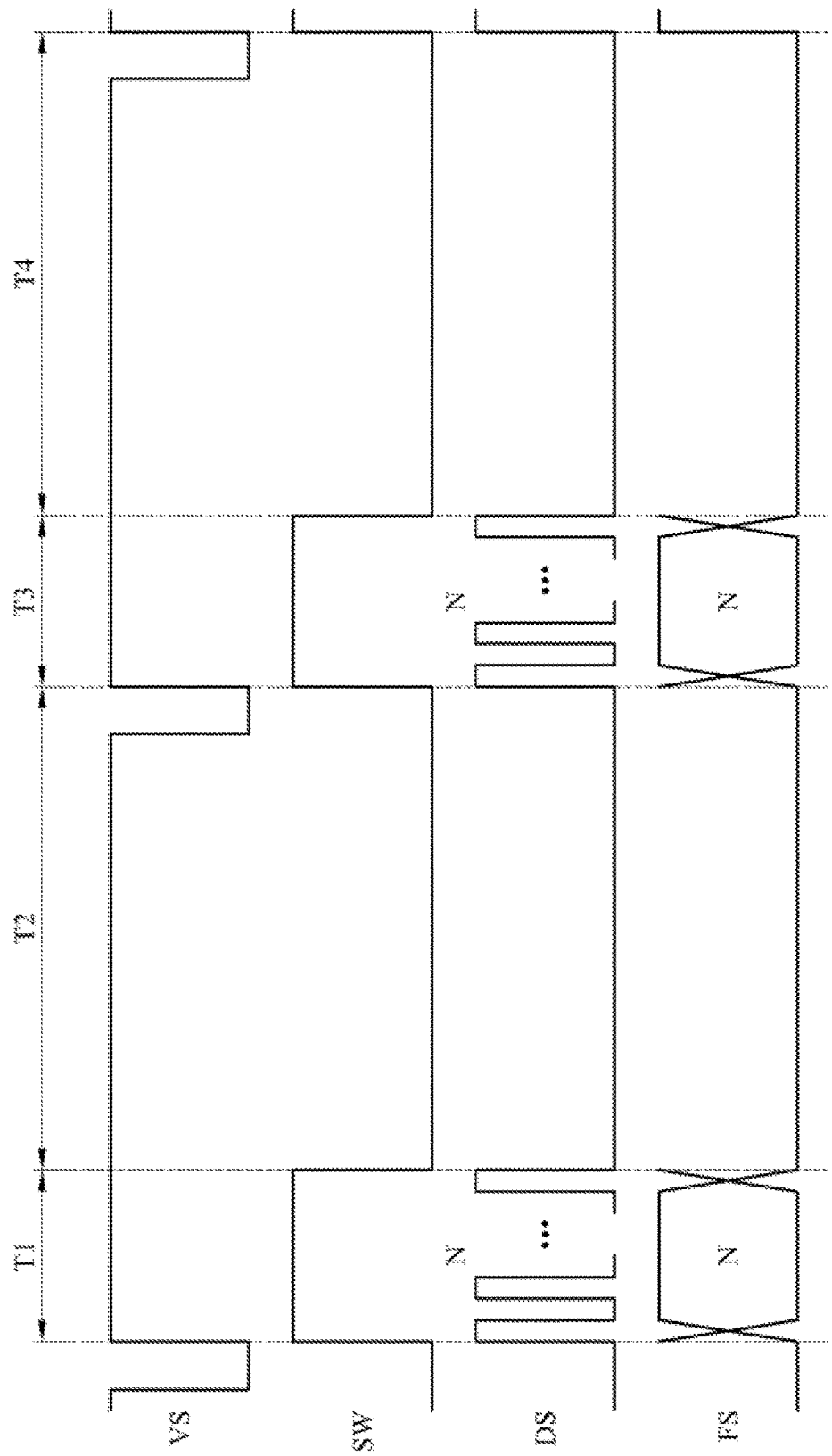
FIG. 4 is an operation timing diagram of the panel structure with a detecting circuit according to an embodiment of the present invention.

In an actual example, referring to FIG. 1, FIG. 2, FIG. 3, and FIG. 4, FIG. 4 is an operation timing diagram of the panel structure with a detecting circuit according to an embodiment of the present invention. As shown in FIG. 4, in a first time period T1, the input signal SW is in the high level state, at this time, enter the detecting mode, and the current path between the control circuit 14 connected to the first signal terminal 1621 and the first terminal P1 of the grounding loop 12 is conducted by the first multiplexer 162. The detecting signal DS output by the control circuit 14 enters the grounding loop 12 from the first terminal P1 of the grounding loop 12. The detecting signal DS passes through the grounding loop 12, gradually passes through the grounding loop 12, and further arrives at the second terminal P2 of the grounding loop 12. At this time, in the detecting mode, the current path between the grounding loop 12 and the second signal terminal 1641 of the second multiplexer 164 is conducted by the second multiplexer 164. The control logic gate 18 receives the feedback signal FS from the second terminal P2 of the grounding loop 12. The feedback signal FS is a signal output from the second terminal P2 of the grounding loop 12 after the detecting signal DS passes through the grounding loop 12.

In this embodiment, in the first time period T1, the detecting signal DS output by the control circuit 14 is a pulse signal having N pulses. After the detecting signal DS passes through the grounding loop 12, the control logic gate 18 receives the feedback signal FS accordingly. As shown in FIG. 3, the control logic gate 18 calculates the quantity of pulses of the feedback signal FS, and the feedback signal FS also has N pulses. At this time, the control logic gate 18 determines that the panel is not broken. Moreover, in the first time period T1, in the detecting mode, the first switch 161 and the second switch 163 are in off states, and the first ground terminal GND1 and the third ground terminal GND3 are separately disconnected from the grounding loop 12. That is, in the detecting mode, the detecting signal DS transmitted in the grounding loop 12 is free from impacts of ground signals of the first ground terminal GND1 and the third ground terminal GND3.

In a subsequent second time period T2, the input signal SW is in the low level state. At this time, enter the protection mode. The current path between the second ground terminal GND2 and the first terminal P1 of the grounding loop 12 is conducted by the first multiplexer 162. The current path between the second terminal P2 of the grounding loop 12 and the fourth ground terminal GND4 is conducted by the second multiplexer 164. The first switch 161 and the second switch 163 are in on states. That is, the first switch 161 and the second switch 163 respectively conduct the current path between the first ground terminal GND1 and the grounding loop 12 and the current path between the third ground terminal GND3 and the grounding loop 12. At this time, the current path between the grounding loop 12 and each of the first ground terminal GND1, the second ground terminal GND2, the third ground terminal GND3, and the fourth ground terminal GND4 is in a conducted state. That is, in the protection mode, when the panel is subjected to ESD, a current generated from static electricity is cancelled through the first ground terminal GND1, the second ground terminal GND2, the third ground terminal GND3, and the fourth ground terminal GND4, and therefore, the panel is prevented from being damaged by the static electricity. Moreover, in the protection mode, the current path between the control circuit 14 and the first terminal P1 of the grounding loop 12 is in a disconnected state, and therefore, the detecting signal DS output by the control circuit 14 is not transmitted to the grounding loop 12.

In an embodiment, resistance of the current path between the first ground terminal GND1 and the grounding loop 12 is less than resistance of the current path between the second ground terminal GND2 and the grounding loop 12. In this embodiment, the second ground terminal GND2 is configured in the control circuit 14, and the first ground terminal GND1 is configured in the panel 10 and/or a flexible circuit board 20. That is, when the panel is subjected to the ESD, by means of a resistance difference, for example, the resistance of the current path between the first ground terminal GND1 and the grounding loop 12 is less than 100 ohms, and the resistance of the current path between the second ground terminal GND2 and the grounding loop 12 is greater than 100 ohms, the current generated by the static electricity is preferably cancelled by the first ground terminal GND1 in the panel 10 and/or the flexible circuit board 20, so as to prevent an excessively large current from directly passing through the second ground terminal GND2 in the control circuit 14, and further to prevent an electronic element in the control circuit 14 from being damaged. The resistance values in the foregoing embodiment are used for illustration only, and the present invention is not limited thereto.

In a third time period T3, the input signal SW changes to the high level state. At this time, enter the detecting mode again. Also, the detecting signal DS output by the control circuit 14 is a pulse signal having N pulses. After the detecting signal DS passes through the grounding loop 12, the control logic gate 18 receives the feedback signal FS accordingly. As shown in FIG. 3, the control logic gate 18 calculates the quantity of pulses of the feedback signal FS, and the feedback signal FS also has N pulses. The control logic gate 18 also determines that the panel is not broken. In a subsequent fourth time period T4, the input signal SW returns to the low level state again, so that the panel structure enters the protection mode. Operation of the panel structure with a detecting circuit in the fourth time period T4 is the same as the operation in the second time period T2, and therefore, details are not described herein again.

Figure 5:
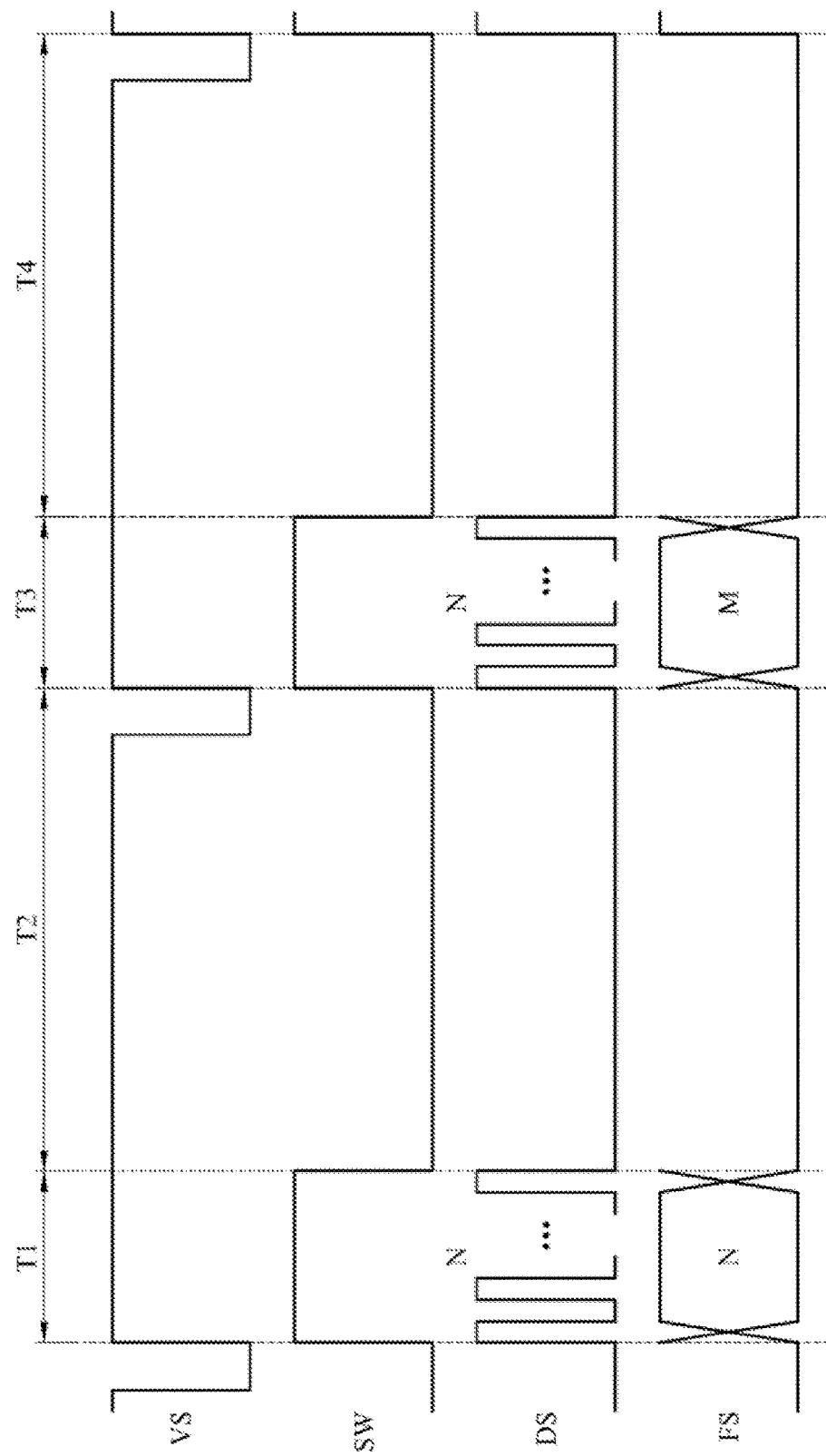
FIG. 5 is an operation timing diagram of a panel structure with a detecting circuit according to another embodiment of the present invention.

However, in another embodiment, referring to FIG. 5, FIG. 5 is an operation timing diagram of a panel structure with a detecting circuit according to another embodiment of the present invention. Different from FIG. 4, in a third time period T3 of FIG. 5, a detecting signal DS output by a control circuit 14 is a pulse signal with N pulses, and a feedback signal FS received by a control logic gate 18 is a pulse signal with M pulses, where N is greater than M. That is, a quantity of pulses of the detecting signal DS is greater than a quantity of pulses of the feedback signal FS. At this time, the control logic gate 18 determines that the panel is broken. Moreover, in another embodiment, a control logic gate 18 calculates that a quantity of pulses of a feedback signal FS is zero, and at this time, the control logic gate 18 also determines that a panel is broken. In an example, when the control logic gate 18 determines that a panel is broken, an alarm signal is generated, so as to notify an operator to deal with the broken panel.

In an embodiment, an input signal SW is controlled by a synchronization signal Vs. As shown in FIG. 4, when the synchronization signal Vs changes from a low level state to a high level state, the input signal SW starts to change to a high level state and maintains at the high level state for a particular time period (e.g. the first time period T1 of FIG. 4). In another subsequent time point, the input signal SW changes to a low level state, and maintains at the low level state for a time period (e.g. the second time period T2 of FIG. 4) until the synchronization signal Vs changes from the low level state to the high level state again. That is, in this embodiment, a frequency of the switchover between a detecting mode and a protection mode is controlled by a frequency of the synchronization signal Vs. When the frequency of the synchronization signal Vs is increased, the frequency of the switchover between the detecting mode and the protection mode is also increased. On the contrary, when the frequency of the synchronization signal Vs is decreased, the frequency of the switchover between the detecting mode and the protection mode is also decreased.

In another embodiment, an input signal SW is controlled by a control signal Vr. That is, the control signal Vr may be transmitted by means of a mobile phone, so as to start a detecting mode. After detecting is carried out for a period of time, for example, 1 microsecond, change from the detecting mode to a protection mode. Different from the foregoing embodiment in which the input signal SW is controlled by the synchronization signal Vs, in this embodiment, the detecting mode is started only when the mobile phone transmits a startup signal Vr. Moreover, in other times, a panel structure is in the protection mode. In this way, a power-saving effect can be achieved.

Figure 6:
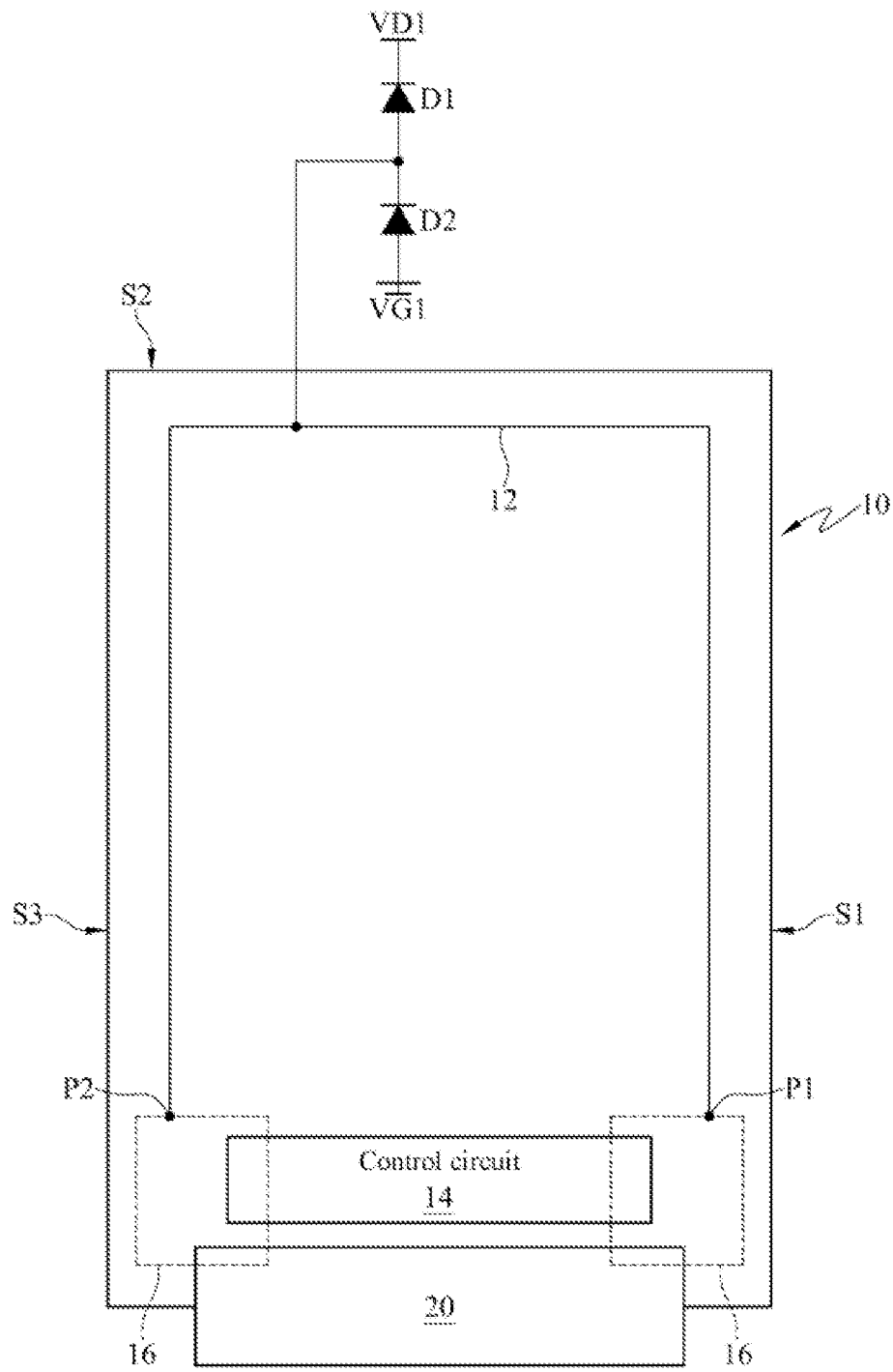
FIG. 6 is a schematic diagram of a panel structure with a detecting circuit according to still another embodiment of the present invention.

In an embodiment, a panel structure with a detecting circuit includes a first diode D1 and a second diode D2. Referring to FIG. 6, FIG. 6 is a schematic diagram of a panel structure with a detecting circuit according to still another embodiment of the present invention. As shown in FIG. 6, an anode terminal of the first diode D1 is electrically connected to a grounding loop 12, a cathode terminal of the first diode D1 receives a first high level voltage VD1. A cathode terminal of the second diode D2 is electrically connected to the grounding loop 12, and an anode terminal of the second diode D2 receives a first ground voltage VG1. When ESD occurs, by means of the configuration of the first diode D1 and the second diode D2, tolerance of the panel for the ESD may be improved. In practice, the first diode D1 and the second diode D2 may be configured at any positions of the grounding loop 12. In another example, a panel structure with a detecting circuit includes multiple groups of diodes, configured at a grounding loop 12, so as to improve tolerance for ESD. The present invention is not limited to the foregoing quantity and positions of the diodes.

In an embodiment, a panel structure with a detecting circuit includes a third diode D3 and a fourth diode D4. As shown in FIG. 2, an anode terminal of the third diode D3 is electrically connected to a signal transmission terminal 1623 of a first multiplexer 162 and a grounding loop 12, and a cathode terminal of the third diode D3 receives a second high level voltage VD2. A cathode terminal of the fourth diode D4 is electrically connected to the signal transmission terminal 1623 of the first multiplexer 162 and the grounding loop 12, and an anode terminal of the fourth diode D4 receives the second ground voltage VG2. The foregoing structure, also disposed between the grounding loop 12 and the second multiplexer 164 (not shown), may also improve tolerance of the panel for ESD. With this structure, in a practical example, it is supposed that a detecting signal DS sent by a control signal 14 is a square wave signal. The square wave signal is generally not ideal, and has a rise time and a fall time, which are supposed as 2 nanoseconds, for example. The rise time defined in this embodiment is a time required for a signal voltage to rise from 1% to 99%, and the fall time is a time required for the signal voltage to fall from 99% to 1%. At this time, as long as a half cycle of the square wave signal is greater than 2 nanoseconds, a control logic gate 18 can receive a feedback signal corresponding to the square wave signal. In another embodiment, a panel structure with a detecting circuit may include more diodes that are connected to a signal transmission terminal 1623 of a first multiplexer 162 and a grounding loop 12 in a same manner. The present invention is not limited to a particular quantity of diodes.

To sum up, the panel structure with a detecting circuit disclosed in the present invention achieves, by sharing the same grounding loop and switching, according to the input signal, the first multiplexer 162, the second multiplexer 164, the first switch 161, and the second switch 163, an antistatic function in the protection mode and a function of detecting whether the panel has a flaw in the detecting mode, so as to reduce space at the periphery of the panel that is occupied by lines, thereby enabling the panel to achieve an effect of a narrow bezel.

Although the present invention is described above by means of the embodiments, the above description is not intended to limit the present invention. Variations and modifications made without departing from the spirit and scope of the present invention all fall within the scope of the present invention. Refer to the appended claims for the protection scope defined by the present invention.

What is claimed is:

1. A detecting circuit for a panel, adapted for detecting the panel that has a grounding loop, wherein the detecting circuit for the panel comprises:
   a first switch, electrically connected to the grounding loop and a first ground terminal, wherein the first switch is off in a detecting mode and on in a protection mode; and
   a first multiplexer, electrically connected to the grounding loop and a second ground terminal, wherein in the detecting mode, a current path between a first signal terminal of the first multiplexer and the grounding loop is conducted by the first multiplexer, and in the protection mode, a current path between the second ground terminal and the grounding loop is conducted by the first multiplexer.

2. The detecting circuit for the panel according to claim 1, further comprising:
a second switch, electrically connected to the grounding loop and a third ground terminal, wherein the second switch is off in the detecting mode and on in the protection mode; and
a second multiplexer, electrically connected to the grounding loop and a fourth ground terminal, wherein in the detecting mode, a current path between the grounding loop and a second signal terminal of the second multiplexer is conducted by the second multiplexer, and in the protection mode, a current path between the grounding loop and the fourth ground terminal is conducted by the second multiplexer.

3. The detecting circuit for the panel according to claim 2, further comprising: a control circuit, electrically connected to the first signal terminal of the first multiplexer, wherein the control circuit is configured to output a detecting signal.

4. The detecting circuit for a panel according to claim 3, wherein the second signal terminal of the second multiplexer is electrically connected to a control logic gate, and in the detecting mode, the second signal terminal of the second multiplexer receives a feedback signal, and the control logic gate determines, according to the feedback signal and the detecting signal, whether the panel has a flaw.

5. The detecting circuit for the panel according to claim 4, wherein when the feedback signal is different from the detecting signal, the control logic gate determines that the panel has the flaw.

6. The detecting circuit for the panel according to claim 1, wherein both of a main control terminal of the first switch and a main control terminal of the first multiplexer receive an input signal, and the detecting circuit for the panel selectively enters the detecting mode or the protection mode according to the input signal.

7. The detecting circuit for the panel according to claim 6, wherein the input signal is controlled by a synchronization signal or a control signal.

8. The detecting circuit for the panel according to claim 1, further comprising:
a first diode, wherein an anode terminal of the first diode is electrically connected to the grounding loop, and a cathode terminal of the first diode receives a first high level voltage; and
a second diode, wherein a cathode terminal of the second diode is electrically connected to the grounding loop, and an anode terminal of the second diode receives a first ground voltage.

9. The detecting circuit for the panel according to claim 1, further comprising:
a third diode, wherein an anode terminal of the third diode is electrically connected to a signal transmission terminal of the first multiplexer and the grounding loop, and a cathode terminal of the third diode receives a second high level voltage; and
a fourth diode, wherein a cathode terminal of the fourth diode is electrically connected to the signal transmission terminal of the first multiplexer and the grounding loop, and an anode terminal of the fourth diode receives a second ground voltage.

10. The detecting circuit for the panel according to claim 1, wherein a resistance of a current path between the first ground terminal and the grounding loop is less than a resistance of the current path between the second ground terminal and the grounding loop.

11. A panel structure with a detecting circuit, comprising:
a panel, having at least a first side edge, a second side edge, and a third side edge;
a grounding loop, extending along the first side edge, the second side edge, and the third side edge, and having a first terminal and a second terminal, wherein the first terminal is adjacent to the first side edge, and the second terminal is adjacent to the third side edge;
a control circuit, configured to output a detecting signal; and
a detecting circuit for the panel, comprising:
a first switch, electrically connected to the first terminal of the grounding loop and a first ground terminal, wherein the first switch is off in a detecting mode and on in a protection mode;
a first multiplexer, electrically connected to the control circuit, the first terminal of the grounding loop, and a second ground terminal, wherein in the detecting mode, a current path between the control circuit and the first terminal of the grounding loop is conducted by the first multiplexer, and in the protection mode, a current path between the second ground terminal and the first terminal of the grounding loop is conducted by the first multiplexer;
a second switch, electrically connected to the second terminal of the grounding loop and a third ground terminal, wherein the second switch is off in the detecting mode and on in the protection mode; and
a second multiplexer, electrically connected to the second terminal of the grounding loop and a fourth ground terminal, wherein in the detecting mode, a current path between the grounding loop and a second signal terminal of the second multiplexer is conducted by the second multiplexer, and in the protection mode, a current path between the second terminal of the grounding loop and the fourth ground terminal is conducted by the second multiplexer.

12. The panel structure with the detecting circuit according to claim 11, wherein the second signal terminal of the second multiplexer is electrically connected to a control logic gate, and in the detecting mode, the control logic gate receives a feedback signal from the second signal terminal of the second multiplexer, and the control logic gate determines, according to the detecting signal and the feedback signal, whether the panel has a flaw.

13. The panel structure with the detecting circuit according to claim 12, wherein when the detecting signal is different from the feedback signal, the control logic gate determines that the panel has the flaw.

14. The panel structure with the detecting circuit according to claim 11, wherein both of a main control terminal of the first switch and a main control terminal of the first multiplexer receive an input signal, and the detecting circuit for the panel selectively enters the detecting mode or the protection mode according to the input signal.

15. The panel structure with the detecting circuit according to claim 14, wherein the input signal is controlled by a synchronization signal or a control signal.

16. The panel structure with the detecting circuit according to claim 11, further comprising:
a first diode, wherein an anode terminal of the first diode is electrically connected to the grounding loop, and a cathode terminal of the first diode receives a first high level voltage; and a second diode, wherein a cathode terminal of the second diode is electrically connected to the grounding loop, and an anode terminal of the second diode receives a first ground voltage.

17. The panel structure with the detecting circuit according to claim 11, further comprising:
a third diode, wherein an anode terminal of the third diode is electrically connected to a signal transmission terminal of the first multiplexer and the grounding loop, and a cathode terminal of the third diode receives a second high level voltage; and
a fourth diode, wherein a cathode terminal of the fourth diode is electrically connected to the signal transmission terminal of the first multiplexer and the grounding loop, and an anode terminal of the fourth diode receives a second ground voltage.

18. The panel structure with the detecting circuit according to claim 11, wherein a resistance of a current path between the first ground terminal and the grounding loop is less than a resistance of the current path between the second ground terminal and the grounding loop.

* * * * *